(12) United States Patent
Frisch

(10) Patent No.: US 7,219,269 B2
(45) Date of Patent: May 15, 2007

(54) SELF-CALIBRATING STROBE SIGNAL GENERATOR

(75) Inventor: Arnold M. Frisch, Portland, OR (US)

(73) Assignee: Credence Systems Corporation, Milpitas, CA (US)

( * ) Notice: Subject to any disclaimer, the term of this patent is extended or adjusted under 35 U.S.C. 154(b) by 518 days.

(21) Appl. No.: 10/628,995

(22) Filed: Jul. 28, 2003

(65) Prior Publication Data

US 2005/0025190 A1   Feb. 3, 2005

(51) Int. Cl.
*G01R 31/28* (2006.01)
*G04F 10/00* (2006.01)
*G04F 8/00* (2006.01)

(52) U.S. Cl. ............ 714/700; 368/118; 368/120; 327/115; 714/727

(58) Field of Classification Search ............ None
See application file for complete search history.

(56) References Cited

U.S. PATENT DOCUMENTS

| | | | | |
|---|---|---|---|---|
| 5,621,774 A | * | 4/1997 | Ishibashi et al. | 375/371 |
| 5,696,772 A | * | 12/1997 | Lesmeister | 714/32 |
| 5,745,533 A | * | 4/1998 | Asada et al. | 375/354 |
| 5,768,283 A | * | 6/1998 | Chaney | 714/700 |
| 5,852,640 A | * | 12/1998 | Kliza et al. | 375/356 |
| 5,923,676 A | * | 7/1999 | Sunter et al. | 714/733 |
| 6,058,496 A | * | 5/2000 | Gillis et al. | 714/727 |
| 6,092,030 A | * | 7/2000 | Lepejian et al. | 702/79 |
| 6,182,236 B1 | * | 1/2001 | Culley et al. | 713/503 |
| 6,728,901 B1 | * | 4/2004 | Rajski et al. | 714/30 |
| 6,798,241 B1 | * | 9/2004 | Bauer et al. | 326/40 |
| 6,967,516 B2 | * | 11/2005 | Okayasu | 327/276 |
| 2003/0126356 A1 | * | 7/2003 | Gustavson et al. | 711/105 |
| 2005/0028050 A1 | * | 2/2005 | Ganry | 714/700 |

* cited by examiner

*Primary Examiner*—Guy Lamarre
*Assistant Examiner*—Steven D. Radosevich
(74) *Attorney, Agent, or Firm*—Daniel J. Bedell; Smith-Hill and Bedell

(57) ABSTRACT

A self-calibrating strobe signal generator for a BIST circuit responds to an edge of an input strobe signal by generating corresponding edges of first and second strobe signals separated in time by a target delay specified by input data. The strobe signal generator includes a multiplexer, a delay circuit and a controller. The multiplexer normally provides the input strobe signal as a multiplexer output signal to the delay circuit which generates edges in each of the first and second strobe signals in response to each edge in the multiplexer output signal with a programmable delay between corresponding first and second strobe signal edges. During a calibration process the control circuit adjusts the programmable delay by counting cycles of a reference clock signal occurring during a predetermined number of cycles of the multiplexer output signal when the multiplexer is set to select the first strobe signal and then the second strobe signal as the source of the multiplexer output signal such that the multiplexer output signal oscillates, and by incrementing or decrementing the programmable delay depending on whether a difference between the counts matches the input data.

21 Claims, 4 Drawing Sheets

SELF-CALIBRATING STROBE SIGNAL GENERATOR

CROSS-REFERENCE TO RELATED APPLICATIONS

The present application discloses subject matter in common with a copending U.S. patent application entitled "BIST CIRCUIT FOR MEASURING PATH DELAY IN AN IC" Ser. No. 10/628,996, filed concurrently herewith.

BACKGROUND OF THE INVENTION

1. Field of the Invention

The present invention relates in general to a self-calibrating strobe signal generator capable of producing edges in two strobe signals with an accurately adjustable delay between them suitable for use in a built-in self-test circuit for measuring path delays in an IC.

2. Description of Related Art

IC designers typically place timing constraints on various signal paths within an IC specifying that a state change in a signal path input signal is to produce a state change in a signal path output signal within some specified maximum target delay. Test equipment can test whether the delay between state changes in a signal path's input and output signals is within a such a target delay by changing the state of a signal at the path input and thereafter sampling the signal at the path output with the specified target delay to determine whether the path output signal has changed state. However, in many cases external test equipment capable of testing path delays will not be able to directly access the input and/or the output terminal of a signal path within an IC to be tested. One solution to that problem is to incorporate a built-in self-test (BIST) circuit directly into the IC providing circuits for measuring the path delay. U.S. Pat. No. 6,058,496 issued May 2, 2000 to Gillis et al describes one such BIST circuit.

FIG. 1 depicts in simplified block diagram form a prior art BIST circuit 10 incorporating principles taught by Gillis et al. The IC in which BIST circuit 10 is embedded includes an input/output (I/O) driver 14 and a receiver 15 linked to one of the IC's I/O pads 16, and the path delay to be measured extends from the input of driver 24 to the output of receiver 25, neither of which is accessible to external test equipment. Various "core logic" circuits internal to the IC normally use driver 14 and receiver 15 to communicate with external circuits but during testing, BIST circuit 10 connects driver 14 and receiver 15 to a pair of latches 24 and 25.

To measure the delay though path 12, a controller 27 signals a multiplexer 20 within BIST circuit 10 to pass a clock signal A through a clock tree 22 (a buffered signal path) to provide a strobe signal B for clocking latch 24 at the input of driver 14. Controller 27 sets the state of a signal DI at the input of latch 24 so that when strobe B clocks latch 24, the input of driver 14 changes state, for example, from a "0" to a "1". When signal path 12 is functioning properly, the state change at the input of driver 14 causes the output signal DO of receiver 15 to change from a 0 to a 1 with a delay that is largely a function of the switching speeds of driver 14 and receiver 15. A programmable delay circuit 26 delays strobe signal B to produce a strobe signal C for clocking latch 25 at the output of receiver 15. The DO signal will be of state "1" immediately after strobe signal C clocks latch 25 if the delay through path 12 is less than the delay through programmable delay circuit 26. Otherwise, the DO signal will be of state "0" when the delay through path 12 is greater than the delay through programmable delay circuit 26.

To measure the delay though path 12, controller 27 iteratively adjusts the delay of programmable delay circuit 26 to find the largest delay for which the DO bit will be 0 immediately following the strobe signal C edge when the driver 14 input signal changes from a 0 to a 1 in response to a signal B edge. At that point, the delay through programmable delay circuit 26 will match the delay through path 12 within the timing resolution of delay circuit 26.

Controller 27 may then measure the delay through programmable delay circuit 26 to determine the delay through path 12. To do so, controller 27 sets multiplexer 20 to feed strobe signal C back to clock tree 22. Since clock tree 22 logically inverts its input to produce strobe signal B, the negative feedback path through multiplexer 20 causes strobe signals B and C to oscillate. With the delay though programmable delay circuit 26 set to match the delay though I/O cell 12, controller 27 counts a number of edges of the strobe signal C occurring during a predetermined number J of cycles of a reference clock signal (CLOCK) having known period. The count (COUNT1) is inversely proportional to the sum of delays through multiplexer 20, clock tree 22 and programmable delay circuit 26. Controller 27 also performs the same count operation while programmable delay circuit 26 is set for 0 delay to produce a second count (COUNT2) inversely proportional to the delay through multiplexer 20 and clock tree 22. From the COUNT1 and COUNT2 values, controller 27 calculates PROG_DELAY data of value proportional to the delay through programmable delay circuit 26 when set to match the delay through path 12 as follows:

$$PROG\_DELAY = (K/COUNT1) - (K/COUNT2) \quad [1]$$

where K is a constant sufficiently larger than any possible value of COUNT1 or COUNT2 to ensure that PROG_DELAY data value will be greater than 0 and will have an adequately wide range over all possible combination of COUNT1 and COUNT2 values. Controller 27 then forwards the computed PROG_DELAY data to external equipment for computing the actual path delay through path 12 from the PROG_DELAY data given known values of K and J and the known period of the CLOCK signal.

BIST circuit 10 can also perform a "go/nogo" test of the delay through path 12 to determine whether the delay is higher or lower than a target delay referenced by TARGET_DELAY data supplied as input to the BIST circuit. To do so controller 27 sets the delay though programmable delay circuit 26 to match the target delay indicated by the TARGET_DELAY data. Thereafter, with multiplexer 20 set to select strobe signal A, the DO bit state following the strobe signal C edge will indicate whether the delay through path 12 is within the target delay. The DO bit is then provided to the external equipment.

To set delay circuit 26 so that its delay matches the specified target delay, controller 27 initially sets multiplexer 20 to select strobe signal C, sets delay circuit 26 for zero delay and then counts the number COUNT2 of edges of the C signal occurring during N cycles of the CLOCK signal. Controller 27 then increments the delay of programmable delay circuit 26, generates the COUNT1 data, and computes the PROG_DELAY data for the current programmable delay setting in accordance with equation [1] above. If the PROG_DELAY data is smaller than TARGET_DELAY, controller again increments the delay of programmable delay circuit 26, determines a COUNT1 value for that programmable delay, then re-computes PROG_DELAY and again compares it to TARGET_DELAY. Controller 27 continues to iteratively increase the programmable delay in this manner until the computed PROG_DELAY value reaches the TARGET_DELAY value. At that point the delay of programmable delay circuit will match the target delay for which path 12 is to be tested.

Note that much of BIST circuit 10 acts as a "self-calibrating strobe signal generator" for generating two strobe signals B and C with a B-to-C delay controlled by input TARGET_DELAY data. BIST circuit 10 is "self-calibrating" in the sense that it automatically measures and adjusts the B-to-C delay using the CLOCK signal period as a timing reference.

A BIST circuit is ideally small, fast and accurate. One drawback to BIST circuit 10 is that to evaluate equation [1] above during the self-calibration process controller 27 employs relatively complex logic, including an arithmetic logic unit (ALU) preferably capable of handling floating point divisions and subtractions. Such complex logic can consume substantial floor space within an IC and may require many clock cycles to perform the necessary calculations once the count data for those calculations has been acquired. The calculation process can therefore extend the time required to test path delays.

The calibration procedure can also be somewhat inaccurate when programmable delay circuit 26 provides substantial residual delay when nominally set for zero delay during the calibration process as is typically the case for conventional programmable delay circuits. Since equation [1] assumes the COUNT2 data value represents zero programmable delay and not a non-zero residual delay, the PROG_DELAY data controller 27 produces underestimates the actual programmable delay by the amount of that residual delay.

What is needed is a strobe signal generator suitable for use in a BIST circuit for providing strobe signals separated with an adjustable delay. The strobe signal generator should include a small self-calibration circuit for quickly and accurately measuring and adjusting the strobe delay without requiring an ALU or other complex data processing hardware.

BRIEF SUMMARY OF THE INVENTION

A self-calibrating strobe generator in accordance with the invention responds to an edge in an input strobe signal by generating a corresponding edge in each of first and second strobe signals, wherein corresponding edges in the first and second strobe signals are separated by a target delay specified by input data.

The strobe generator includes a multiplexer, a delay circuit and a control circuit. The multiplexer receives the input strobe signal and the first and second strobe signals, and may provide any one of them as its multiplexer output signal. The delay circuit generates corresponding edges in the first and second strobe signals in response to each edge of the multiplexer output signal with the corresponding edges in the first and second strobe signals being separated in time by a delay controlled by delay control data. The multiplexer normally selects the input strobe signal as the source of the multiplexer output signal so that an edge in the input strobe signal will trigger the corresponding edges in the first and second strobe signals.

The control circuit carries out a calibration process to set the delay control data so that the programmable delay between corresponding edges of the first and second control signals matches the target delay referenced by the input data. The control circuit initially signals the multiplexer to select the first strobe signal as the multiplexer output signal, thereby causing the multiplexer output signal to oscillate with a period equal to twice the delay between the multiplexer input and the first strobe signal output of the delay circuit. The control circuit then generates a count of a number of cycles of a stable reference clock signal occurring during a predetermined number of cycles of the multiplexer output signal.

The control circuit then signals the multiplexer to select the second strobe signal as the multiplexer output signal, thereby causing the multiplexer output signal to oscillate with a period equal to twice the delay between the multiplexer input and the second strobe signal output of the delay circuit. The control circuit then offsets the count by the number of cycles of the stable reference clock signal occurring during the same predetermined number of cycles of the multiplexer output signal. The resulting count is proportional to the programmable delay provided by the delay circuit.

The control circuit compares the resulting count to the input data to determine whether the programmable delay is higher or lower than the target delay specified by the input data and then increments or decrements the programmable delay accordingly so at to make it closer to the target delay. The control circuit repeats the calibration process iteratively incrementing or decrementing the programmable delay until it matches the target delay to the extent the delay circuit to resolve delays.

The control circuit suitably need employ only a pair of counters, a comparator and some sequencing logic to generate the count representing the programmable delay. Since the count itself directly indicates the programmable delay, the control circuit does not require an arithmetic logic unit (ALU) or other complicated data processing circuits to calculate the programmable delay based on the generated count. The control circuit therefore requires relatively little floor space in an IC and requires substantially no additional computation time after generating the count to determine whether to increment or decrement the programmable delay.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

The present invention relates to self-calibrating strobe signal generator. The specification below describes an exemplary strobe signal generator in accordance with the invention in the context of an application within a built-in self-test (BIST) circuit for measuring path delays within an integrated circuit (IC). However, those of skill in the art will appreciate that a self-calibrating strobe signal generator in accordance with the invention can be employed in other applications.

Figure 2:
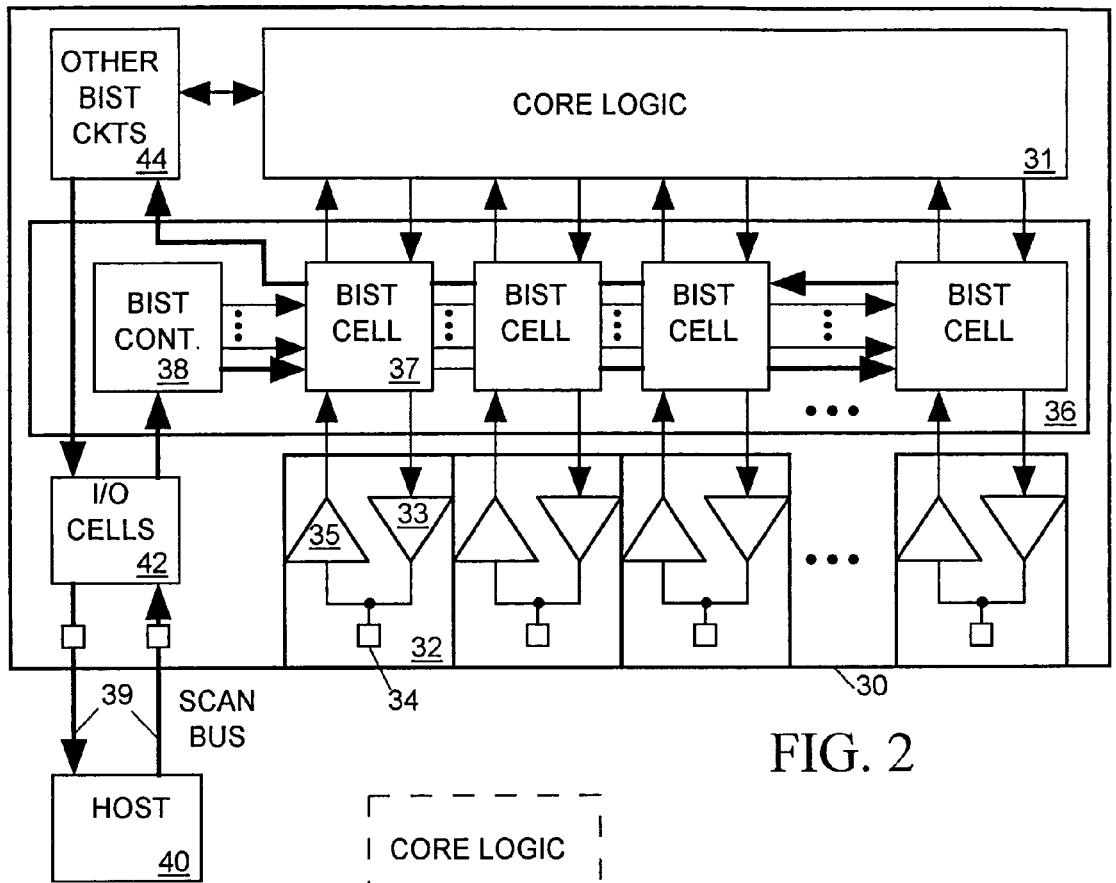
FIG. 2 depicts in block diagram form an example BIST circuit in accordance with invention for measuring path delays within an integrated circuit (IC).

FIG. 2 depicts an IC 30 including core logic 31 for communicating with external circuits through a set of I/O cells 32. Each I/O cell 32 includes a driver 33 for forwarding a signal from core logic 31 outward to the external circuits via a pad 34 on the surface of the IC, and a receiver 35 for forwarding an incoming signal arriving on pad 34 to core logic 31. While an IC designer might like to place timing constraints on driver 33 and receiver 35 specifying path delays through them are to be within some maximum target delay, it would not be possible for external test equipment to directly measure the path delay though either driver 33 or receiver 35 to determine whether they satisfy their timing constraints because only one terminal of each device 33 or 35 is directly accessible to the external test equipment via pad 34. Note, however, that a state change in a digital signal applied to the input of driver 33 will cause a corresponding state change in the signal at the output of receiver 35 with a delay equal to the sum of the delays through driver 33 and receiver 35. A designer might therefore combine the timing constraints on driver 33 and receiver 35 of an I/O cell 32 by specifying that the sum of their path delays should be no greater than some particular target delay. In such case a BIST circuit within IC 30 having access to the input of driver 33 and the output of receiver 35 of each I/O cell 32 could test each I/O cell to determine whether the path delay through its driver 33 and receiver 35 meets that combined timing constraint.

IC 30 therefore includes a BIST circuit 36 in accordance with the invention for testing each I/O cell 32 to determine whether the path delays through its driver 33 and receiver 35 is within a specified target delay. BIST circuit 36 includes a set of BIST cells 37 and a BIST controller 38. Each BIST cell 37 resides between core logic 31 and a corresponding one of I/O cells 32 and normally links the core logic to the corresponding I/O cell so that the core logic can communicate with external circuits. However, when BIST circuit 36 is to test I/O cells 32, each BIST cell 37 disconnects its corresponding I/O cell 32 from core logic 31 and reconnects it to internal circuits for testing the I/O cell.

External equipment such as a host computer 40 or an IC tester can communicate with BIST controller 38 and other BIST circuits 44 via a scan bus 39. BIST controller 38 and other BIST circuits 44 include internal shift registers (scan registers) connected in series by a data line of scan bus 39 to form a "scan chain". Host computer 40 can shift data into the scan registers of the scan chain via a single outgoing scan bus data line and can read data shifted out of the scan registers via a single return scan bus data line. Scan bus 39 also includes a clock line supplied to each scan register enabling host computer 20 to clock the data through the scan registers, and includes one or more enable lines permitting it to tell BIST circuits 38 and 44 to check their internal scan registers for valid data or commands or to write data into the scan register.

To tell BIST controller 38 to start a test, host computer 40 shifts a START command into the scan register within BIST controller 38 and asserts a scan bus enable line telling it to respond to any command that may currently be in its scan register. BIST controller 38 then responds to the START command by initially signaling BIST cells 37 to disconnect I/O cells from core logic 31 and to connect it to test circuits inside the BIST cells. BIST controller 39 then sends two strobe signals to BIST cells 37. An edge of a first strobe signal tells each BIST cell 37 to transmit a signal edge to the input of the driver 33 of its corresponding I/O cell 32. An edge of the second strobe signal tells each BIST cell 37 to sample the signal appearing at the output of the receiver 35 of its corresponding I/O cell 32 and to store a bit representing its state. BIST controller 38 sets the delay between the first and second strobe signal edges equal to the specified target delay for the I/O cells so that the state of the bit each BIST cells 37 stores in response to the second strobe signal indicates whether the delay though its corresponding I/O cells is higher or lower than the target delay.

After BIST cells 37 have stored their indicating bits, BIST controller 38 configures each BIST cell 37 to act as a single-bit scan register included in the scan chain of scan bus 39. Host computer 40 may thereafter use scan bus 39 to acquire the indicating bits out of BIST cells 37 and to determine from the acquired indicating bits whether the path delay through each I/O cell 32 is greater than or less than the specified target delay.

Figure 3:
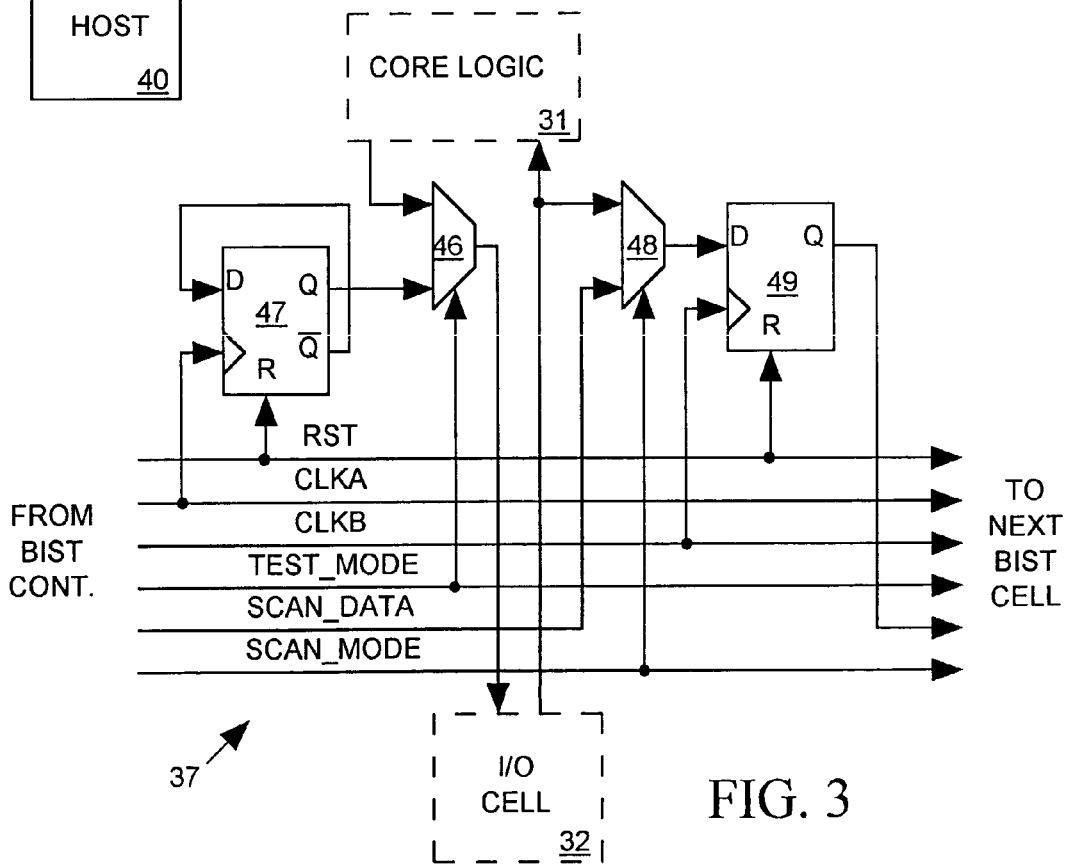
FIG. 3 depicts one of the BIST cells of FIG. 2 in more detailed lock diagram form.

FIG. 3 illustrates one of BIST cells 37 of FIG. 2 in more detailed block diagram form. The other BIST cells 37 are similar. BIST cell 37 includes a multiplexer 46 controlled by a TEST_MODE signal from BIST controller 38 normally delivering an output signal from core logic 31 to the input of I/O cell 32. However, during a test, multiplexer 46 connects a Q output of a flip-flop 47 to the input of I/O cell 32. BIST controller 38 initially resets flip-flop 47 via a reset signal (RST) and then clocks flop-flop 47 via a first strobe signal CLKA, thereby causing the Q output of flip-flop 47 to change state. Multiplexer 46 delivers the signal edge produced at the flip-flop's Q output to the input of the driver 33 within I/O cell 32. When I/O cell 32 is working properly, the signal edge will subsequently appear at the output of the receiver 35 within I/O cell connected to an input of another multiplexer 48. Multiplexer 48 normally delivers the I/O cell output signal to a D input of another flip-flop 49 clocked by a second strobe signal CLKB supplied by BIST controller 38.

BIST controller 38 sets the time delay between CLKA and CLKB strobe signal edges equal to the specified target delay through I/O cell 32 so that immediately after receiving the CLKB signal, the state of the Q output of flip-flop 49 will indicate whether the I/O cell's path delay is within the specified maximum delay. After transmitting the CLKB signal edge, BIST controller 38 sets a SCAN_MODE signal to tell multiplexer 48 to connect an incoming SCAN_DATA line of the scan bus to the D input of flip-flop 49. Since the Q output of flip-flop 49 drives the outgoing SCAN_DATA line of the scan bus, multiplexer 48 and flip-flop 49 now act as a 1-bit scan register included in the scan chain.

When host computer 40 thereafter wants to read the state of the bit at the Q output of the flip-flop 49 within each BIST cell 37, it carries out a scan bus read/write operation. Whenever host computer 40 pulses the scan bus clock signal to shift data bits through the scan registers, BIST controller pulses the CLKB signal input to flip-flop 49, thereby shifting scan data arriving on the incoming SCAN_DATA line outward on the outgoing SCAN_DATA line. Upon acquiring the indicating bit at the output of the flip-flop 49 within each BIST cell 32, host computer 40 can determine from the states of those bits whether the delay though each I/O cell 32 is within the specified target delay.

Figure 4:
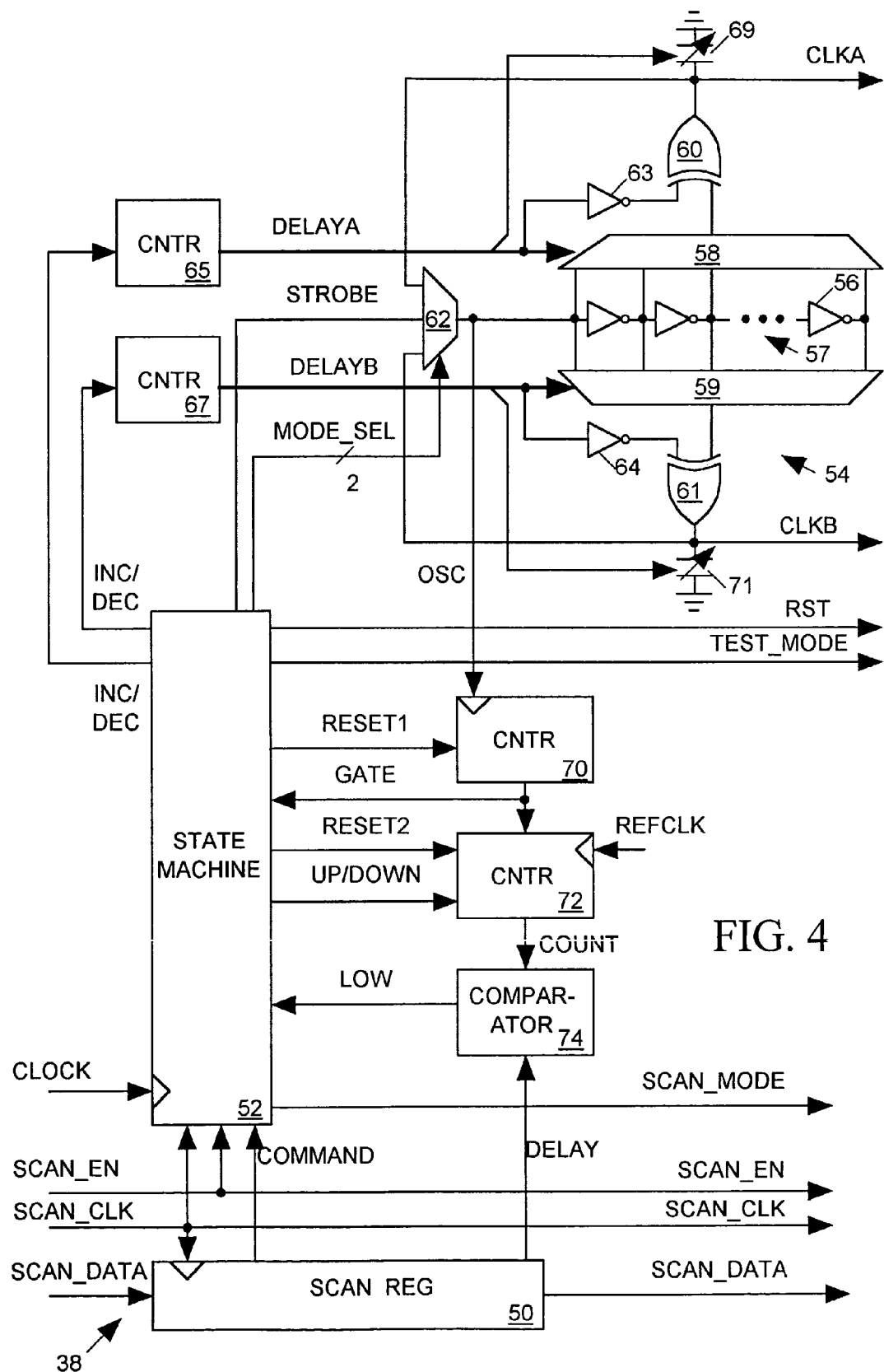
FIG. 4 depicts the BIST controller of FIG. 4 in more detailed block diagram form.

FIG. 4 depicts BIST controller 38 of FIG. 2 in more detailed block diagram form. BIST controller 38 includes a scan register 50 for storing data and commands from host computer 40. A state machine (or sequencer) 52 responds to any command in scan register 50 when host computer 40 asserts a scan enable line (SCAN_EN) of the scan bus. State machine 52 normally sets the TEST_MODE signal input to each BIST cell 37 (FIG. 3) to tell the BIST cells to connect the core logic to the I/O cells. State machine 52 also normally sets the SCAN_MODE signal so that the multiplexer 48 of each BIST cell 37 connects the incoming SCAN_DATA line to the D input of flip-flop 49 (FIG. 3). Whenever host computer 40 (FIG. 2) pulses the SCAN_CLK line of the scan bus to shift data through the scan chain, state machine 52 responds by pulsing a strobe signal (STROBE) input to a strobe generator 54 telling it to pulse the CLKB input to flip-flop 49. Thus during a normal mode of IC operation, BIST controller 38 causes the LIST cells 37 to act like scan registers.

When host computer 40 shifts a START command into scan register 50 and pulses an enable line (SCAN_EN) of the scan bus, state machine 52 sets the TEST_MODE signal to tell the multiplexers 46 in each BIST cell 37 to select the Q output of flip-flop 47 (FIG. 3). State machine 52 also pulses the RST signal to reset the flip-flop 47 within each BIST cell 37 and sets the SCAN_MODE signal to switch the multiplexer 48 in each BIST cell 37 to deliver the I/O cell's receiver output to the D input of flip-flop 49.

State machine 52 then supplies a STROBE signal edge to a strobe signal generator 54 telling it to generate an edge in the CLKA strobe signal followed by an edge in the CLKB strobe signal. As discussed below, controller 38 has preset strobe signal generator 54 to provide a delay between the CLKA and CLKB strobe signal edges matching a specified target path delay for the I/O cells under test. Following the CLKB strobe signal edge, the bit at the D output of the flip-flop 49 in each BIST cell will indicate whether the path delay though corresponding I/O cell 32 is within the specified target delay. State machine 52 then sets the TEST_MODE signal to reconnect core logic 31 to the I/O cells (FIG. 2) and sets the SCAN_MODE line so that the BIST cells 37 again act as a part of the scan chain. Host computer 40 is then able to use scan bus 39 to access the indicating bit at the Q output of the flip-flop 49 of every BIST cell 37.

Strobe signal generator 54 of FIG. 4 is a programmable delay circuit suitably including a set of inverters 56 connected in series to form a tapped delay line 57 and including a matching pair of multiplexers 57 and 58, each for connecting a selected tap of delay line 57 to an input of an XOR gate 60 or 61. XOR gate 60 generates strobe signal CLKA and XOR gate 61 generates strobe signal CLKB. During a test, state machine 52 sets MODE_SEL data controlling a multiplexer 62 so that it connects the STROBE signal from state machine 52 to the input of delay line 57. STROBE signal edges thus propagate to each successive tap with a delay equal to the product of the switching delay of each inverter 56 and the number of inverters between multiplexer 62 and the delay line tap. To adjust the delay between corresponding edges of strobe signals CLKA and CLKB, state machine 52 suitably adjusts DELAYA and DELAYB count outputs of a pair of counters 65 and 67 controlling multiplexer 58 and 59 tap selections.

An inverter 63 couples a bit of the DELAYA data to an input of XOR gate 60 while an inverter 64 similarly couples a 1 bit of the DELAYB data to an input of XOR gate 61. XOR gates 60 and 61 and inverters 63 and 64 ensure that the polarity of relationships between state changes in the STROBE signal and state changes in the CLKA and CLKB signals is independent of the delay line tap each multiplexer 58 or 59 selects.

A variable capacitor 69 controlled by M least significant bits of the DELAYA data couples the CLKA output signal to ground and a variable capacitor 71 controlled by M least significant bits of the DELAYB data couples the CLKB signal to ground, where M may be one or more. Capacitor 69 (or 71) can increase the STROBE-to-CLKA delay (or STROBE-to-CLKB delay) by increasing the capacitive loading it provides at the output of XOR gate 60 (or 61). The range over which variable capacitors 69 and 71 can increase the CLKA or CLKB delay is suitably approximately equal to the until path delay through one inverter 56. When delay line 57 has N taps, it has an adjustable CLKA-to-CLKB delay range from 0 to N times the switching delay of one inverter 56 and the upper N bits of the DELAYA and DELAY B data grossly control the delay with a resolution equal to the delay through one inverter 56. The lower M bits finely adjust the delay with a resolution less than the delay through one inverter 56. Capacitors 69 and 71 may alternatively be connected to the outputs of multiplexers 58 and 59.

Before sending a START command to tell state machine 52 to begin testing I/O path delays, host computer 40 (FIG. 2) sends state machine 52 a CALIBRATE command telling it to initially set the delay between CLKA and CLKB as large as possible without exceeding a specified target delay through the I/O cells. Along with the CALIBRATE command, host computer 40 writes TARGET data into scan register 50 indicating the target delay. Responding to the CALIBRATE command, state machine 52 first sets the DELAYA output of counter 65 so that multiplexer 58 selects the first tap of delay line 57 and so that variable capacitor 69 minimizes its capacitive loading on XOR gate 60, thereby minimizing the STROBE-to-CLKA delay. State machine 52 also sets the DELAYB output of counter 67 so that multiplexer 59 selects the last tap of the delay line and so that capacitor 71 provides maximum capacitance at the output of XOR gate 61, thereby maximizing the STROBE-to-CLKB delay. Thus, state machine 52 initially maximizes the CLKA-to-CLKB delay. State machine 52 then switches multiplexer 62 so that it feeds the output of XOR gate 60 back to the input of delay line 56 thereby causing the delay line input signal (OSC) to oscillate with a period equal to twice the path delay between the input of multiplexer 62 and the output of XOR gate 60. State machine 52 then sends a RESET1 signal to counter 70. Counter 70 normally holds its output signal (GATE) low, but the RESET1 signal tells it to drive the GATE signal high and to thereafter begin counting edges of the OSC signal. When its count reaches a predetermined limit, counter 70 drives the GATE signal low again.

The GATE signal acts as an enable input to an up/down counter 72 that counts up or down on each edge of a stable reference clock signal REFCLK when the GATE signal is high. State machine 52 also pulses a RESET2 signal to reset the COUNT output of counter 72 to 0. State machine 52 initially sets an UP/DOWN signal input to counter 72 to tell it to count down when the GATE signal is high. Thus during the time counter 70 holds the GATE high, counter 72 decrements COUNT on each edge of REFCLK. When counter 70 subsequently drives GATE low, the COUNT output of counter 72 will represent a negative number indicating a number REFCLK signal edges occurring during a predetermined number K of cycles of the OSC signal.

After the GATE signal goes low, state machine 52 sets counter 72 to count up and switches multiplexer 62 so that it feeds the output of XOR gate 61 back to the input of delay line 56, thereby causing the OSC signal to oscillate with a period equal to twice the path delay between the input of multiplexer 62 and the output of XOR gate 61. State machine 52 then resets counter 70. Counter 70 then drives the GATE signal high again for the predetermined number K of OSC signal cycles, and counter 72 increments its output COUNT in response to each REFCLK signal edge while the GATE signal is high. When counter 70 subsequently drives the GATE signal low again to halt counter 72, the COUNT output of counter 72 will represent a positive number proportional to the delay between the CLKA and CLKB signals as follows:

COUNT=DELAY(2K/PREF)

where DELAY is the delay between the CLKA and CLKB signals, and PREF is the period of reference clock signal REFCLK.

Since PREF and K are known constants, host computer 40 can compute the value the COUNT output counter 72 should produce when strobe generator 54 is adjusted to provide a CLKA-CLKB delay (DELAY) equal to a desired target delay. Host computer 40 sets the TARGET data in scan register 50 to that value when it sends the CALIBRATE command to state machine 52. A comparator 74 supplies a LOW signal input to STATE machine 62 indicating whether the COUNT value output of counter 72 is lower than the TARGET data value in scan register 50. After counter 72 produces COUNT data representing the CLKA-CLKB delay, state machine 52 checks the LOW signal state. If the LOW signal indicates that COUNT is higher than TARGET, state machine 52 decrements DELAYA (or increments DELAYB) to decrease the CLKA-CLKB delay by the delay of one inverter 56, and then repeats the calibration process so that counter 72 produces COUNT data representing the new, smaller CLKA-CLKB delay. If the LOW signal again indicates the COUNT value is still higher than TARGET, state machine 52 again decrements the tap setting of multiplexer 59 and repeats the process. State machine 52 iteratively reduces the CLKA-to-CLKB delay in this manner until the LOW signal indicates the last generated COUNT data value is lower than the TARGET data value. At that point the CLKA-CLKB delay will be as large as possible without exceeding the target delay will therefore "match" the target delay within the ability of strobe generator to resolve delays. State machine 52 then signals multiplexer 62 to once again select the STROBE signal as input delay line 57 to prepare BIST controller 30 to receive a START command from host computer 40.

In addition to using BIST circuit 36 to perform the above-described go/nogo test on I/O cells 32, host computer 40 can also use BIST circuit 36 to measure the actual path delay though each I/O cell 32. To do so host computer 40 first sets the TARGET data to a small value, commands BIST circuit 36 to calibrate its strobe generator 54 for that delay and then commands the BIST circuit to perform a GO/NOGO test on the I/O cells 32 for that small delay. Host computer 40 then reads the indicating bits produced by BIST cells 37 to determine which I/O cells 32, if any, have delays smaller than the current TARGET data setting. Host computer 40 then increments the TARGET data to representing a next higher delay and signals BIST circuit 36 to repeat the calibration and testing processes. The indicating bits host computer 40 obtains after this second iteration indicate which of the I/O cells have delays smaller than that next higher delay. When host computer 40 iteratively repeats the process for each possible TARGET data value, it will be able to determine from the indicating data it acquires the path delay of each I/O cell 32 within a resolution of the switching delay of a single inverter gate 56.

While BIST circuit 30 is illustrated herein as testing delays through bi-directional I/O cells 32, it can also be used for testing a delay through a uni-directional I/O cell by customizing it to provide a BIST cell 37 with access to both the input and the output of the uni-directional driver or receiver within the cell are supplied to a BIST cell 37. BIST circuit 30 can also test delays though paths within an IC other than I/O cell signal paths.

Figure 1:
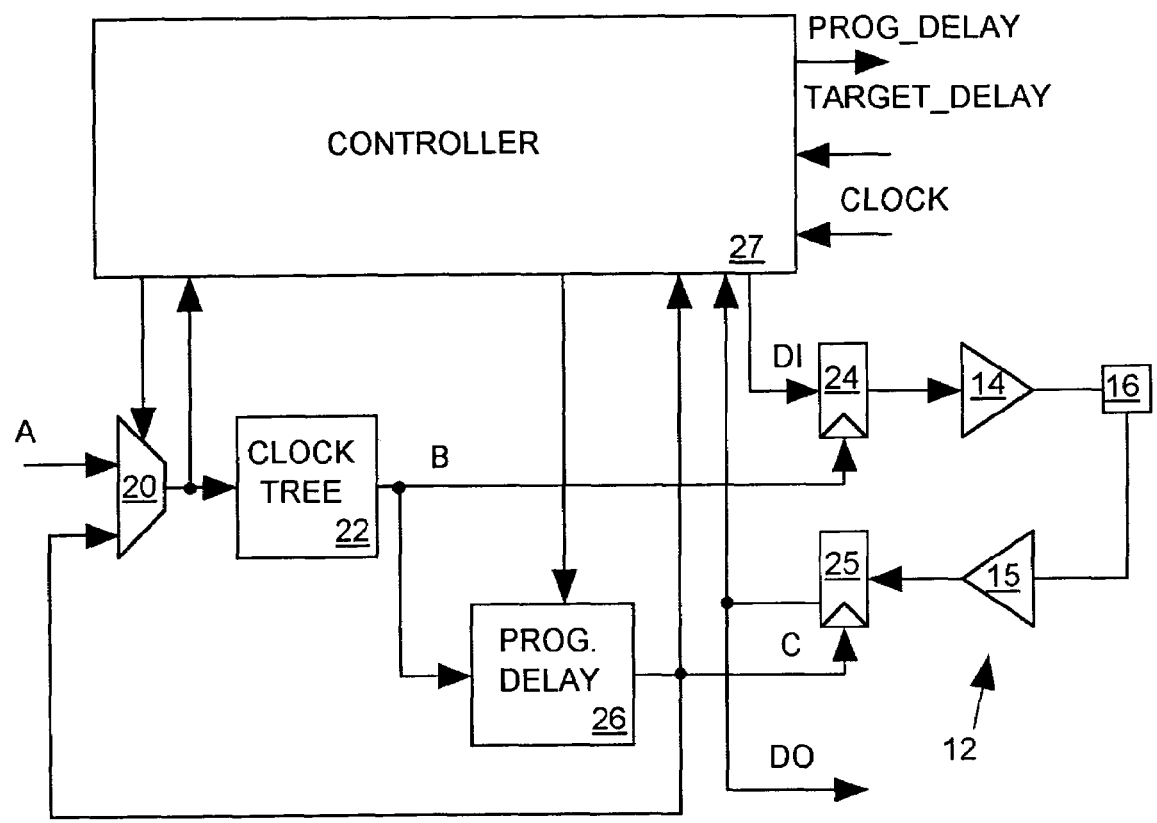
FIG. 1 depicts in block diagram form a prior art built-in self-test (BIST) circuit for measuring a path delay within an integrated circuit (IC).

As can be seen from FIG. 1, BIST controller 38 requires only two counters 70 and 72 and a comparator 74 to determine whether the CLKA-to-CLKB delay is above or below the target delay specified by the input TARGET data. Note that since the COUNT data produced by counter 72 is directly proportional to the CLKA-to-CLKB delay, controller 38 does not require an ALU or other complex hardware to convert the COUNT data into data proportional to the CLKA-to-CLKB delay. Thus once counter 72 has generated the COUNT data no additional computation clock cycles are needed.

Although the state machine 52 with BIST controller 38 generates three outputs RST, TEST_MODE, and SCAN_MODE that are specific to the nature of the BIST cells 37 being controlled, most of BIST controller 38 acts as a self-calibrating strobe signal generator that can produce CLKA and CLKB strobe signals with a CLKA-to-CLKB edge delay controlled by the input TARGET data. Thus those of skill in the art will appreciate that BIST controller 38 can be easily adapted for use in connection with other applications where two precisely timed strobe signals are needed.

In this application, it is not necessary for the CLKA and CLKB strobe signal delays with respect to the STROBE signal to be independently adjustable since it is necessary only to adjust the CLKA-to-CLKB delay. Since state machine 52 can adjust the CLKA-to-CLKB delay over its full range by setting multiplexer 58 to select the smallest delay (tap 0) and by adjusting only the selection only of multiplexer 59, in this application counter 65 can be eliminated by hardwiring the DELAYA data to select tap 0. Conversely, we can eliminate counter 67 when DELAYB is hardwired to set multiplexer 59 to select the last tap of the delay line. However, in other applications requiring independent control of both the STROBE-to-CLKA and STROBE-to-CLKB delays, both counters 65 and 76 should be used.

Figure 5:
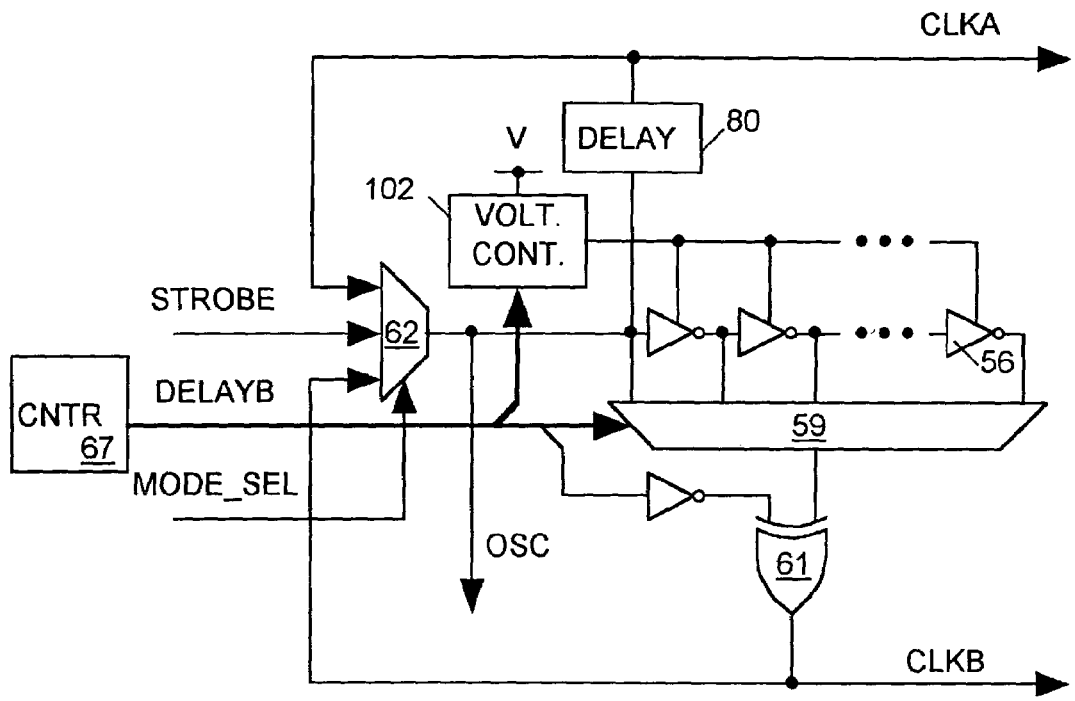
FIGS. 5 and 6 depict example alternative embodiments of the strobe generator of FIG. 4.

As illustrated in FIG. 5, it is also possible in applications where only the selection of multiplexer 59 need be adjusted to eliminate counter 65, multiplexer 58, inverter 63 and XOR gate 60 and derive the CLKA signal from the output of multiplexer 62 via a delay circuit 80 mimicking the path delay through multiplexer 59 and XOR gate 61. Delay circuit 80 can be omitted, but including delay circuit 80 ensures that when multiplexer 59 is set to select tap 0, the CLKA-to-CLKB delay will be substantially zero. Delay circuit 80 can suitably be implemented as a sequence of gates substantially similar to the sequence of gates within multiplexer 59 and XOR gate 61 included in the STROBE-to-CLKB signal path. To provide for fine control over the STROBE-to-CLKB delay, a variable capacitor controlled by the least significant bits of the DELAYB data could control variable capacitance connected to the output of XOR gate 61. However, in the strobe generator of FIG. 5, the least significant bits of the DELAYB data control the power supply voltage a voltage control circuit 102 supplies to inverters 56. Since the path delay through each inverter 56 is a function of its supply voltage, the least significant bits of the DELAYB data can finely control the STROBE-to-CLKB delay.

Figure 6:
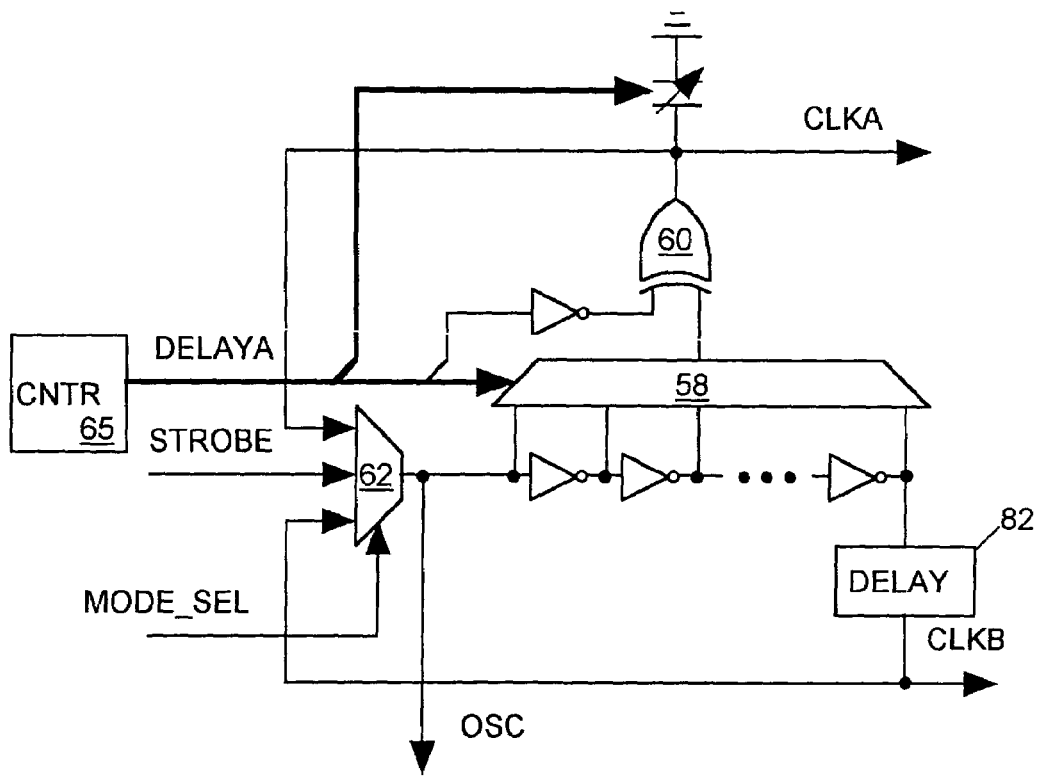

Alternatively, as illustrated in FIG. 6, we can replace counter 65, multiplexer 59, inverter 64 and XOR gate 61 and derive the CLKB signal from the last tap of the delay line via a delay circuit 82 having a delay matching the inherent delay through multiplexer 58 and XOR gate 60.

While the strobe signal generator in accordance with the preferred embodiment of the invention as described herein above employs a programmable delay circuit employing a tapped delay line 57 and two multiplexers 58 and 59 to control the delay between the CLKA and CLKB signals, the invention can be broadly practiced in connection with any kind of programmable delay circuit.

The foregoing specification and the drawings depict exemplary embodiments of the best modes of practicing the invention, and elements or steps of the depicted best modes exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiments of the invention depicted in the specification and drawings.

The invention claimed is:

1. An apparatus for responding to each edge of an input strobe signal by generating a corresponding edge in each of first and second strobe signals, wherein corresponding edges in the first and second strobe signals are separated by a target delay referenced by input data, the apparatus comprising:
   a first multiplexer for receiving the input strobe signal and the first and second strobe signals, and for providing any one of the input, first and second strobe signals selected by first selection control data as a first multiplexer output signal;
   a first circuit for generating the first and second strobe signals in response to the first multiplexer output signal such that each edge in the first multiplexer output signal subsequently produces a corresponding edge in the first and second strobe signals, with corresponding edges in the first and second strobe signals being separated in time by a programmable delay set by delay control data; and
   a control circuit receiving the input data and the first multiplexer output signal for supplying the first selection control data to the first multiplexer and for supplying the delay control data to the first circuit.

2. The apparatus in accordance with claim 1 wherein the control circuit carries out a calibration process wherein it sets the delay control data so that the programmable delay between corresponding edges of the first and second strobe signals matches the target delay referenced by the input data.

3. The apparatus in accordance with claim 2 wherein following the calibration process, the control circuit sets the first selection control data so that the first multiplexer provides the input strobe signal as the first multiplexer output signal such that a next edge of the input strobe signal will result in corresponding edges in the first and second strobe signals separated in time by the target delay.

4. The apparatus in accordance with claim 2 wherein during the calibration process the control circuit generates count data indicating a difference between first and second quantities,
   wherein the first quantity is a number of edges of a reference clock signal occurring during a first period determined by counting a predetermined number of edges of the first multiplexer output signal occurring while the first multiplexer is providing the first strobe signal as the first multiplexer output signal, and
   wherein the second quantity is a number of edges of a reference clock signal occurring during a second period determined by counting the predetermined number of edges of the first multiplexer output signal occurring while the first multiplexer is providing the second strobe signal as the first multiplexer output signal.

5. The apparatus in accordance with claim 4, wherein during the calibration process the control circuit iteratively carries out a process of generating the count data, comparing the count data to the input data, and adjusting the delay control data to determine a value for the delay control data that sets the programmable delay equal to the target delay.

6. The apparatus in accordance with claim 4 wherein the control circuit decrements the count data in response to edges of the reference clock signal during the first period and increments the count data in response to edges of the reference clock signal during the second period.

7. The apparatus in accordance with claim 6, wherein during the calibration process the control circuit iteratively carries out a process generating the count data, compares the count data to the input data, and adjusting the delay control data to determine a value for the delay control data that sets the programmable delay equal to the target delay.

8. The apparatus in accordance with claim 7 wherein following the calibration process, the control circuit sets the first selection control data so that the first multiplexer provides the input strobe signal as the first multiplexer output signal such that a next edge of the input strobe signal will result in corresponding edges in the first and second strobe signals separated in time by the target delay.

9. The apparatus in accordance with claim 6 wherein the control circuit comprises:
   a first counter for counting edges of the first multiplexer output signal and for generating a gate signal indicating when the first and second periods are occurring;
   a second counter for decrementing the count data in response to edges of the reference clock signal when the gate signal indicates the first period is occurring and for incrementing the count data in response to edges of the reference clock signal when the gate signal indicates the second period is occurring; and
   means for incrementing or decrementing the delay control data depending on relative magnitudes of the count data and the delay data.

10. The apparatus in accordance with claim 1 wherein the first circuit comprises:
    a tapped delay line having N taps for conveying the first multiplexer output signal to each of its N taps in succession, where N is greater than two;
    a second multiplexer for providing the first multiplexer output signal conveyed to any one of the N taps selected by the delay control data as a second multiplexer output signal; and
    first means for generating the first strobe signal in response to the second multiplexer output signal.

11. The apparatus in accordance with claim 10 wherein the first circuit further comprises:
second means for generating the second strobe signal in response to the first multiplexer output signal with a delay substantially matching a delay between an edge of the first multiplexer output signal arriving at any tap selected by the delay control data and a corresponding edge of the first strobe signal generated by the second means.

12. The apparatus in accordance with claim 10 wherein the first circuit further comprises:
a third multiplexer for providing the first multiplexer output signal conveyed to any one of the N taps selected by the delay control data as a third multiplexer output signal, wherein the delay control data independently controls the tap selection made by the second and third multiplexers; and
second means for generating the second strobe signal in response to the third multiplexer output signal.

13. The apparatus in accordance with claim 10
wherein the first circuit provides a second signal path for delaying the second multiplexer output signal with a second delay to produce the second strobe signal, the second delay being controlled by the delay control data,
wherein the second signal path includes a second number of gates,
wherein the delay control data controls a magnitude of the second number, and
wherein the second delay is a function of a sum of delays through the second number of gates.

14. The apparatus in accordance with claim 13
wherein a delay through each gate of the first number of gates is variable and a function of the delay control data, and
wherein a delay through each gate of the second number of gates is variable and a function of the delay control data.

15. The apparatus in accordance with claim 13
wherein the first signal path comprises a first variable capacitor,
wherein the delay control data controls a first capacitance of the first variable capacitor, and
wherein the first delay is a function of the first capacitance,
wherein the second signal path comprises a second variable capacitor,
wherein the delay control data controls a second capacitance of the second variable capacitor, and
wherein the second delay is a function of the second capacitance.

16. The apparatus in accordance with claim 1
wherein the first circuit provides a first signal path for delaying the first multiplexer output signal with a first delay to produce the first strobe signal, the first delay being controlled by the delay control data,
wherein the first signal path includes a first number of gates,
wherein the delay control data controls a magnitude of the first number, and
wherein the first delay is a function of a sum of delays through the first number of gates.

17. The apparatus in accordance with claim 16
wherein a delay through each gate of the first number of gates is a function of the delay control data.

18. The apparatus in accordance with claim 16
wherein the first signal path comprises a first capacitor having an adjustable first capacitance,
wherein the delay control data controls the first capacitance, and
wherein the first delay is a function of the first capacitance.

19. An apparatus for responding to each edge of an input strobe signal by generating a corresponding edge in each of first and second strobe signals, wherein corresponding edges in the first and second strobe signals are separated by a target delay referenced by input data, the apparatus comprising:
means for generating an edge of the first strobe signal in delayed response to each edge of the input strobe signal;
a first multiplexer for receiving the input strobe signal and the second strobe signal and for providing either one of the input and second strobe signals selected by first selection control data as a first multiplexer output signal;
a tapped delay line comprising a plurality of gates connected in series for receiving the first multiplexer output signal and producing an edge in a separate tap signal at an output of each gate in delayed response to each edge in the first multiplexer output signal, wherein a signal delay through each gate is a function of voltage supplied to the gates;
means for adjusting the voltage supplied to the gates in response to delay control data;
means for receiving the tap signal produced by each gate as input, for selecting one of the tap signals as a selected tap signal in response to the delay control data and for generating an edge in the second strobe signal in response to each edge in the selected tap signal; and
a control circuit receiving the input data and the first multiplexer output signal for supplying the first selection control data to the first multiplexer and for supplying the delay control data to the means for adjusting the voltage supplied to the gates, wherein the first selection control data and the delay control data are functions of the input data.

20. The apparatus in accordance with claim 19 wherein the control circuit carries out a calibration process wherein it sets the delay control data so that a delay between corresponding edges of the first and second control signals matches the target delay referenced by the input data.

21. The apparatus in accordance with claim 14 wherein the calibration process comprises setting the first selection control data so that the first multiplexer selects the second strobe signal as the first multiplexer output signal and measuring a period of the first multiplexer output signal.

* * * * *

UNITED STATES PATENT AND TRADEMARK OFFICE
CERTIFICATE OF CORRECTION

| | |
|---|---|
| PATENT NO. | : 7,219,269 B2 |
| APPLICATION NO. | : 10/628995 |
| DATED | : May 15, 2007 |
| INVENTOR(S) | : Arnold M. Frisch |

It is certified that error appears in the above-identified patent and that said Letters Patent is hereby corrected as shown below:

<u>Column 14</u>
Line 52, "claim 14" should be deleted and replaced with --claim 20--.

Signed and Sealed this

Nineteenth Day of June, 2007

JON W. DUDAS
*Director of the United States Patent and Trademark Office*